(12) United States Patent
Kronrod et al.

(10) Patent No.: US 6,972,556 B2
(45) Date of Patent: Dec. 6, 2005

(54) SYSTEM AND METHOD FOR MEASURING THE POWER CONSUMED BY A CIRCUIT ON A PRINTED CIRCUIT BOARD

(75) Inventors: James M. Kronrod, Moraga, CA (US); James J. Freeman, Milpitas, CA (US); Kelly Coffey, Los Gatos, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/894,240

(22) Filed: Jul. 20, 2004

(65) Prior Publication Data

US 2004/0257063 A1 Dec. 23, 2004

Related U.S. Application Data

(63) Continuation of application No. 09/892,850, filed on Jun. 28, 2001.

(60) Provisional application No. 60/243,267, filed on Oct. 26, 2000.

(51) Int. Cl.[7] ............................. G01R 11/32; G01R 7/00
(52) U.S. Cl. .................................. 324/142; 324/103 R
(58) Field of Search ............................. 324/126, 105, 324/699, 158.1, 713, 142, 103 R; 702/57, 702/60; 338/49

(56) References Cited

U.S. PATENT DOCUMENTS

| 720,335 | A | | 2/1903 | Eastman ..................... 324/126 |
| 1,446,995 | A | * | 2/1923 | Sines ......................... 324/105 |
| 4,186,339 | A | * | 1/1980 | Finger ........................ 324/142 |
| 4,713,607 | A | | 12/1987 | Pepper |
| 5,095,274 | A | | 3/1992 | Brokaw |
| 5,386,188 | A | | 1/1995 | Minneman et al. ......... 324/126 |
| 6,023,138 | A | | 2/2000 | Fried et al. ................. 318/434 |

FOREIGN PATENT DOCUMENTS

DE 198 38 974 A1 3/2000

OTHER PUBLICATIONS

"Using PCB as a Current Shunt", Electronics World and Wireless World, Reed Business Publishing, vol. 99, No. 1691, Oct. 1993, pp. 862-863.

* cited by examiner

*Primary Examiner*—Anjan Deb
*Assistant Examiner*—Amy He
(74) *Attorney, Agent, or Firm*—Squire, Sanders & Dempsey LLP

(57) ABSTRACT

A system for measuring power of a circuit on a printed circuit board (PCB) including first and second circuits, a power strip, a power plane, and a calibration strip. The power strip is connected to the power plane to the first circuit, is embedded in the PCB during the manufacturing process, and also has at least two vias for measuring a voltage drop. The calibration strip is also embedded in the PCB during the manufacturing process and has at least two vias for measuring a voltage drop. The second circuit is configured to measure a voltage drop across the power strip as a first voltage and a voltage drop across the calibration strip as a second voltage, and to calculate the power being fed to the first circuit based on the first voltage and the second voltage.

21 Claims, 10 Drawing Sheets

SYSTEM AND METHOD FOR MEASURING THE POWER CONSUMED BY A CIRCUIT ON A PRINTED CIRCUIT BOARD

CROSS REFERENCES TO RELATED ART

This is a Continuation of application Ser. No. 09/892,850 filed Jun. 28, 2001 which claims priority from Provisional Application No. 60/243,267 entitled, "BOARD LEVEL POWER MONITOR" filed Oct. 26, 2000, which is hereby incorporated herein by reference.

BACKGROUND OF THE INVENTION

1. Field of the Invention

This invention relates to systems and methods for measuring power in a circuit. More particularly, this invention relates to on-board systems and methods for measure power of a circuit or sub-circuit on a Printed Circuit Board.

2. Description of the Related Art

Printed Circuit Boards (PCBs) are well known. PCBs are a convenient and effective way to manufacture and implement both analog and digital electronics, often referred to as integrated circuits. Today, integrated circuits on PCBs are used in a multitude of applications, such as in computers, networking equipment, electronic appliances, stereos, etc.

In general, a PCB is manufactured to design specifications and lays out the electronic circuits for the associated application, such as the wiring for an integrated circuit. Then, after the PCB has been manufactured, the elements and various components of the integrated circuit are mounted onto the PCB at touch points, such as by soldering, etc.

As integrated circuits have become more and more complex, their related power consumption and distribution becomes more demanding. Accordingly, accurate testing of an integrated circuit's power needs is essential to the production of quality integrated circuits, and in turn, electrical and electronic equipment.

Often, analytical tools such as component modeling tools or simulation tools (e.g., SPICE®, etc.) are used by design engineers to help predict power consumption and distribution across an integrated circuit. However, many factors make the accurate prediction of the characteristics of an integrated circuit unreliable. For example, it is common for a PCB to be manufactured to tolerances of up to ±10%. Similarly, component tolerances may vary. Thus, the modeling of an integrated circuit may be used for design purposes, but might not accurately predict the actual power consumption and power distribution characteristics of an integrated circuit on a PCB, which could change with the varying tolerances. Accordingly, electronics manufacturers still must rely on conventional, laboratory type testing of integrated circuits manufactured on PCBs.

The physical testing of a integrated circuit on a PCB is not without its problems. For example, it is a common practice to test an integrated circuit by "breaking up" or isolating sections of a circuit or sub-circuit on the PCB. In order to isolate a circuit or sub-circuit, a component (e.g., an inductor, etc.) is usually removed and a power source is then spliced in, such as by a wire. Then, various voltage and current measurements may be made using conventional meters (e.g., voltage and current meters, oscilloscopes, etc.). However, as electronic components become smaller, physically isolating circuits on a PCB and accurately attaching scopes and meters to the circuit becomes more cumbersome, and is often impossible.

Ideally, to perform such testing, a precision measurement of the current feeding a circuit is necessary, which can be achieved by providing a precision current source in series with the circuit, or by adding a precision resistor in series with a voltage source to a circuit. For example, referring to prior art FIG. 1, shown is a simple block diagram of a circuit 100 on a PCB. The circuit 100 has a load 102 and a voltage source 104. The power plane or PCB has a trace resistance level which is represented by R2. A precision resistor R1 is placed in series with the power plane (R2), and a precision current can be measured feeding load 102, such as by using a current meter across the precision resistor R1. However, by placing a component in series with the load (circuit) 102, the reliability of the circuit is directly related to the reliability of the precision resistor R1. Accordingly, the reliability of the entire circuit may be reduced.

Adding components in series with the circuit itself could affect the inductances of the circuit and accordingly, affect overall performance. Moreover, precision resistors also have the problem that they often cannot handle high current.

In view of the aforementioned problems, there is a need for new and improved systems and methods for measured the power of a circuit on a PCB that is accurate and nonintrusive. Such systems and methods should limit the number of additional components added to the circuit being tested, and should allow testers better access to circuits or less cumbersome methods to make measurements.

SUMMARY OF THE INVENTION

The present invention provides a system for measuring core power of a circuit on a printed circuit board (PCB) including first and second circuits, a power plane, a power strip, and a calibration strip. The power plane is for feeding the first circuit. The power strip is for providing power to the power plane disposed in the PCB, is connected to the power plane and has at least two vias for measuring a voltage drop. The calibration strip has a predetermined width and is disposed in the PCB. The calibration strip also has at least two vias for measuring a voltage drop. The second circuit is configured to measure a first voltage drop across at least two vias of the power strip as a first voltage and a second voltage drop across at least two vias of the calibration strip as a second voltage, and to perform a power calculation by calculating a power being fed to the first circuit based on the first voltage and the second voltage.

According to another embodiment of the present invention, provided is a system for measuring power within a circuit on a printed circuit board (PCB) including a first power supply, a first circuit, a power plane feeding the first circuit, a power strip, and a second circuit. The power strip is embedded in the PCB and connects the first power supply to the power plane. The power strip has at least two vias for measuring a voltage drop. The second circuit is configured to measure a voltage drop across the power strip as a first voltage, the temperature of the power strip, and calculate the power consumed by the first circuit based on the first voltage and the temperature.

According to another embodiment of the present invention, provided is a method for determining the core power of a circuit on printed circuit board (PCB) having a circuit being fed power from a power source via a power plane, The method includes the step of embedding a power strip having a predetermined length and width into the PCB during the manufacturing of the PCB. Next, a second power supply is connected to the power strip, which is grounded to allow a current flow through the power strip. Next, a voltage drop across the power strip is measured as a first voltage. Next, a voltage drop across the power plane is measured as a second voltage. Finally, the power to the circuit is calculated based on the first and second voltages, the predetermined length and the predetermined width.

BRIEF DESCRIPTION OF THE DRAWINGS

For full understanding of the present invention, reference should be made to the accompanying drawings, wherein.

DESCRIPTION OF THE PREFERRED EMBODIMENTS

Figure 1:
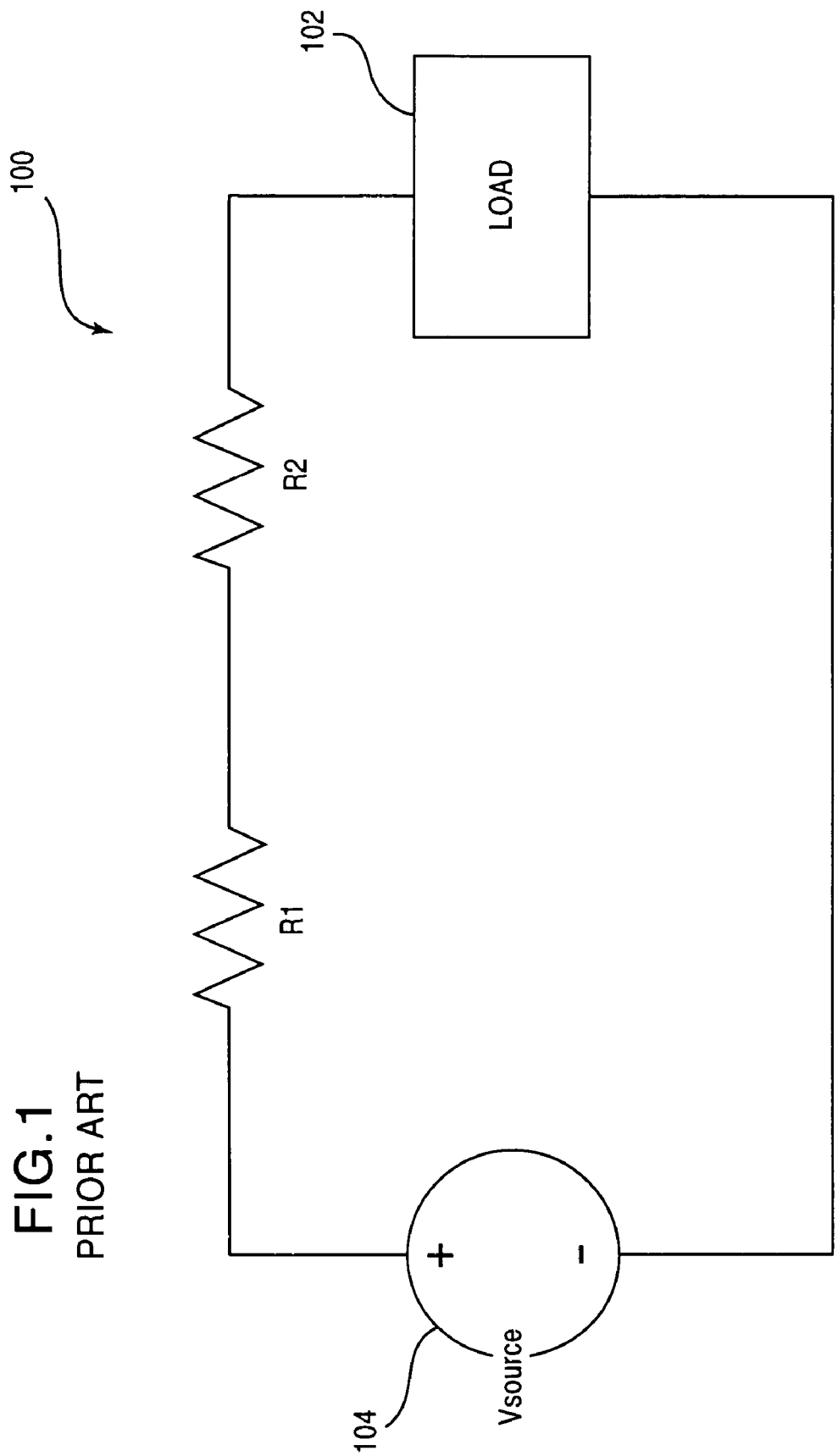
FIG. 1 is a schematic of a prior art system for measure power of a circuit on a PCB.
Figure 2:
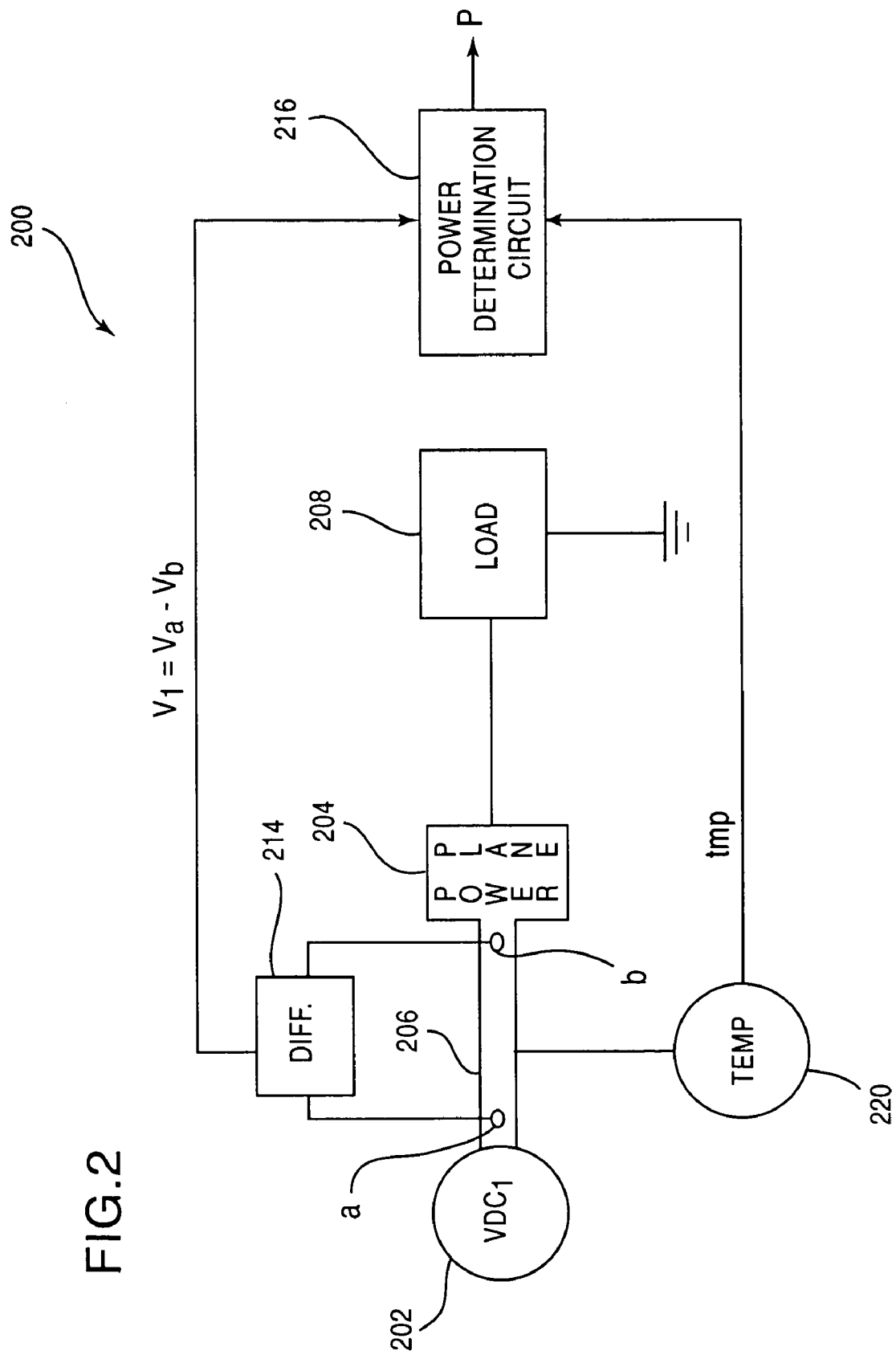
FIG. 2 is a block diagram of an on-board system for measure power of a circuit on a PCB according to a first embodiment of this invention.

Referring to FIG. 2, shown is an block diagram of a system for measuring the core power of a circuit on a printed circuit board (PCB) according to a first embodiment of the present invention. In particular, system 200 includes a power source 202 (VDC1), such as a DC voltage source, which supplies power to a power plane 204 via a power strip 206 (e.g., a wide copper strip). The power plane 204 is used to supply power to a circuit 208, which has a predetermined load.

The power strip 206 has vias a and b, voltage drop points, placed a predetermined distance apart. The voltage drop V1 across the vias a and b are input into a differencing circuit 214 which measure the voltage drop V1 and outputs a voltage signal equal to the voltage drop V1 to a power determination circuit 216. A temperature meter 220 measures the temperature of the power strip 206 and outputs a temperature signal tmp to the power determination circuit 216. The power determination circuit 216 calculates the core power P of the circuit 208 and outputs a power signal P. As will be explained in detail below, various calculations may be made to determine the power based on a number of factors which could include voltage drop V1, the size of power strip 206, the material of each, the temperature tmp of the power strip 206, and the load of circuit 208. The power signal P can be output from power determination circuit 216 to a display circuit, calibrating circuit, or other circuit as desired.

Figure 3:
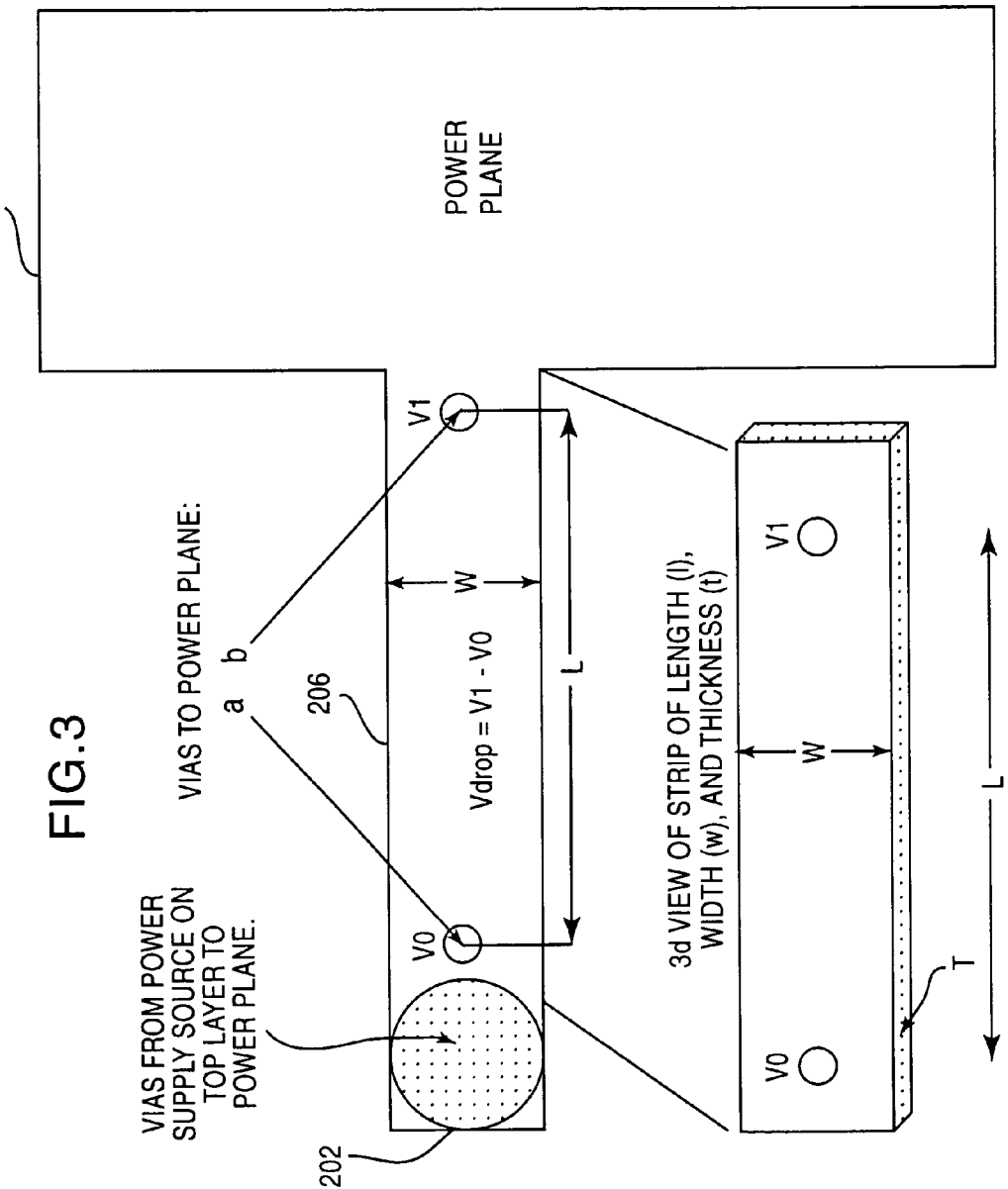
FIG. 3 is an expansion view of the power supply and power plane of the on-board system for measure power of a circuit on a PCB according to a first embodiment of this invention.

The calculation of power is shown in more detail with reference to FIG. 3, which shows a close-up view of the power plane 204 and voltage source 202 connected by the power strip 206. Power strip 206 is shown having a length L, a width W and a thickness T. The material of the power strip can preferably be a good conductor, such as pure copper. According to a preferred embodiment, the power strip may be one ounce Cu with a thickness of 0.0012–0.0014 inches, but the present invention is not intended to be limited as such. The thickness T, resistivity of the material (p) and thermal coefficient of the material (e) are properties of the material used. The length L and width W may be controlled by design.

In this embodiment of the present invention, the resistance R of the power strip 206 is calculated by taking into account the temperature (tmp) of the power strip 206, thermal coefficient (e), resistivity (p), the thickness T, and the known length L and width W. Accordingly, the following formulas may be used to calculate power:

$$R=(1+(tmp-20)*e)*L*p/W*T$$

$$P=VDC1*V1/R$$

Accordingly, the power determination circuit 216 may have the known values L, W, T, p and e stored in memory or input dynamically from an external source.

Since the thickness of the power strip 206 may be unknown or may vary depending on the manufacturing tolerances of the process used to manufacture the PCB, an on board self calibrating circuit can be added to system 200 to eliminate the need for accurate measurement of the thickness.

Figure 4:
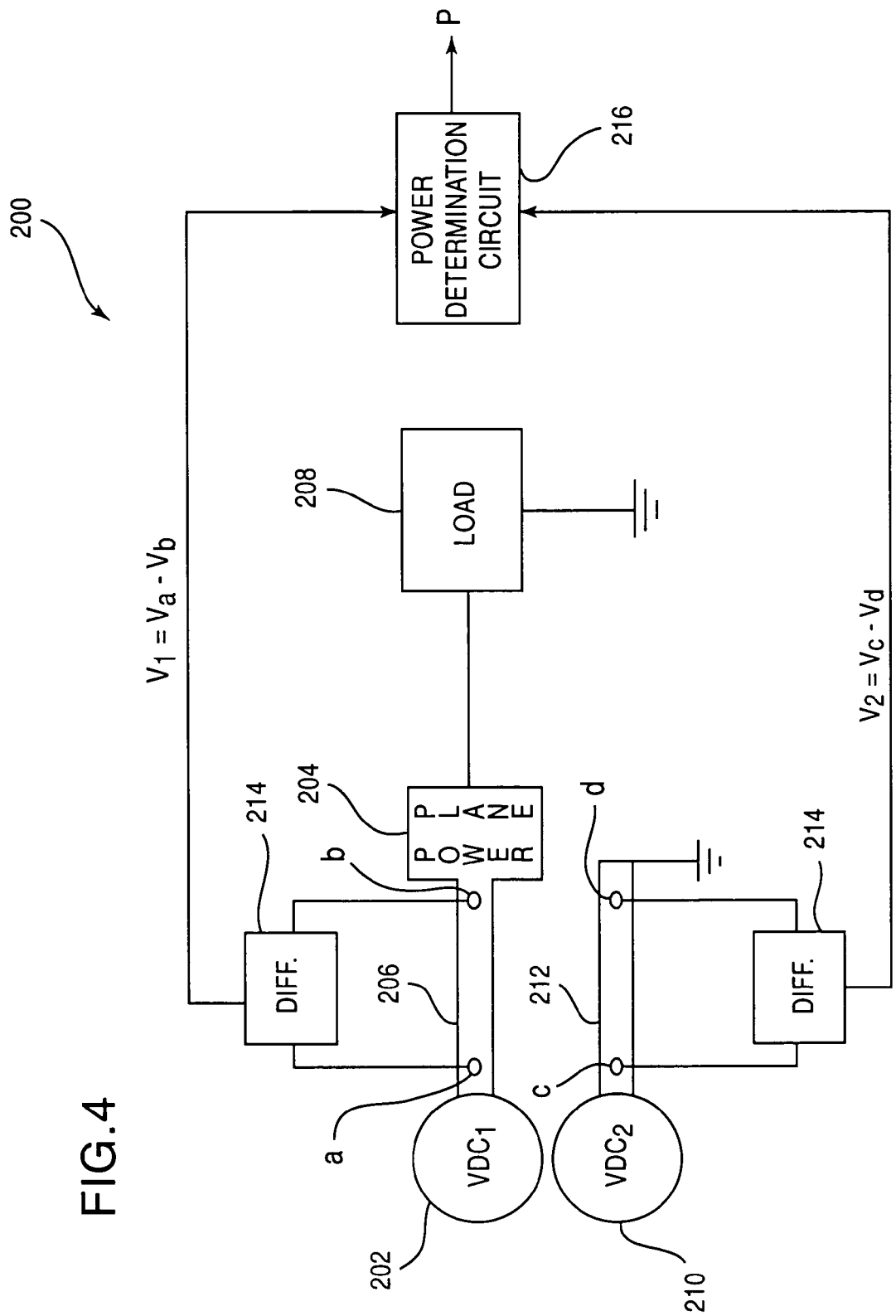
FIG. 4 is a block diagram of an on-board system for measure power of a circuit on a PCB according to a second embodiment of this invention.

Referring to FIG. 4, shown is an block diagram of a system for measuring the core power of a circuit on a printed circuit board according to a second embodiment of the present invention. In particular, system 200 includes a power source 202, such as a DC voltage source, supplies power to a power plane 204 via a power strip 206. The power plane 204 is used to supply power to a circuit 208, which has a predetermined load. A second voltage supply 210 is connected to a calibration strip 212, which may be aligned in the same proximity as the power strip 206 on the PCB for reasons that will be explained below. The calibration strip 212 is directly grounded so that there is no loading of power source 210 other than the strip itself.

The power strip 206 and the calibration strip 212 each have vias a–d, voltage drop points, placed at a predetermined distance apart. The voltage drops V1 and V2 across the vias are input into difference circuits 214 which measure the voltage drop across each via. As an example, two differencing circuits are shown. The voltage drops measured, V1 and V2, are entered into a power determination circuit 216 which can calculate the core power of the circuit 208. As will be explained in detail below, various calculations may be made to determine the power based on a number of factors which could include V1 and V2, the size of calibration strip 212, power strip 206, the material of each, the temperature of the calibration strip 212 and the power strip 206, and the load of circuit 208. The power can be output as a signal P from power determination circuit 216 to a display circuit, calibrating circuit, or other circuit as desired.

As shown and described with reference to FIG. 3, the power P consumed by the load 208 can be calculated based on the voltage drop V1 across the power strip 206, the temperature (tmp) of the power strip 206, the thermal coefficient (e), resistivity (p), the thickness T, length L and width W. However, as explained above, the thickness T, thermal coefficient (e), and resistivity (p) may not always be controlled by design and may not be predicted with extreme accuracy because of varying manufacturing processes used to manufacture the PCB. Therefore, in this embodiment, the calibration strip 212 may be placed in a close proximity to the power strip 206 and is made of the same material (e.g., copper or some other conductor or semi-conductor). Thus, regardless of the manufacturing process, the thickness of the calibration strip 212 will be equal to or substantially equal to the thickness of the power strip 206. Also, since the calibration strip 212 is placed very close to the power strip 206, the temperature of calibration strip 212 on board will be equal to or substantially equal to the temperature of the power strip 206 during operation. Accordingly, the need for accurate measurement of the temperature tmp or thickness T can be eliminated, and power calculations can be based on known and controlled, or easily measured variables.

Resistance can be determined in terms of the resistance of power strip 206 (R1) and calibration strip 212 (R2) as follows:

$$R1=(1+(tmp-20)*e)*L1*p/W1*T$$

$$R2=(1+(tmp-20)*e)*L2*p/W2*T$$

$$p=R2*W2*T/(1+(tmp-20)*e)*L2, \text{ therefore}$$

$$R1=L1*R2*W2/W1*L2$$

The resistance of the calibration strip 212 R2 may be determined by accurate measurement of the current through the strip, such as by adding a precision resistor in series with calibration strip 212 or by providing a precision current source (not shown). Thus, the power of the circuit 208 may be determined without intrusive meters or without adding additional components to the voltage path of the circuit 208.

Referring to FIG. 5, shown is a block diagram of a system for measuring the core power of a circuit on a printed circuit board according to a third embodiment of the present invention.

This embodiment is similar to the second embodiment, but differs in that the power determination circuit 216 is replaced by an analog to digital (A/D) converter 218 and a CPU. Since the voltage drops V1 and V2 can be very small, a means for amplifying the voltage drops V2 and V2 may used. As an example, differencing circuits 214 may be operational amplifier circuits which feed an amplified voltage drops V1 and V2 to the A/D converters 218, which can accurately convert the amplified voltages V1 and V2 into digital signals V1' and V2', which are fed to the CPU 220. The CPU 220 can then calculate power P using the calculations already described above.

Although a CPU 220 is shown, the present invention is not meant to be limited to embodiments including a CPU. For example, one having ordinary skill in the art will understand that power calculations described herein may be performed using a variety of calculating means and methods, such as with digital and analog circuits.

Figure 5A:
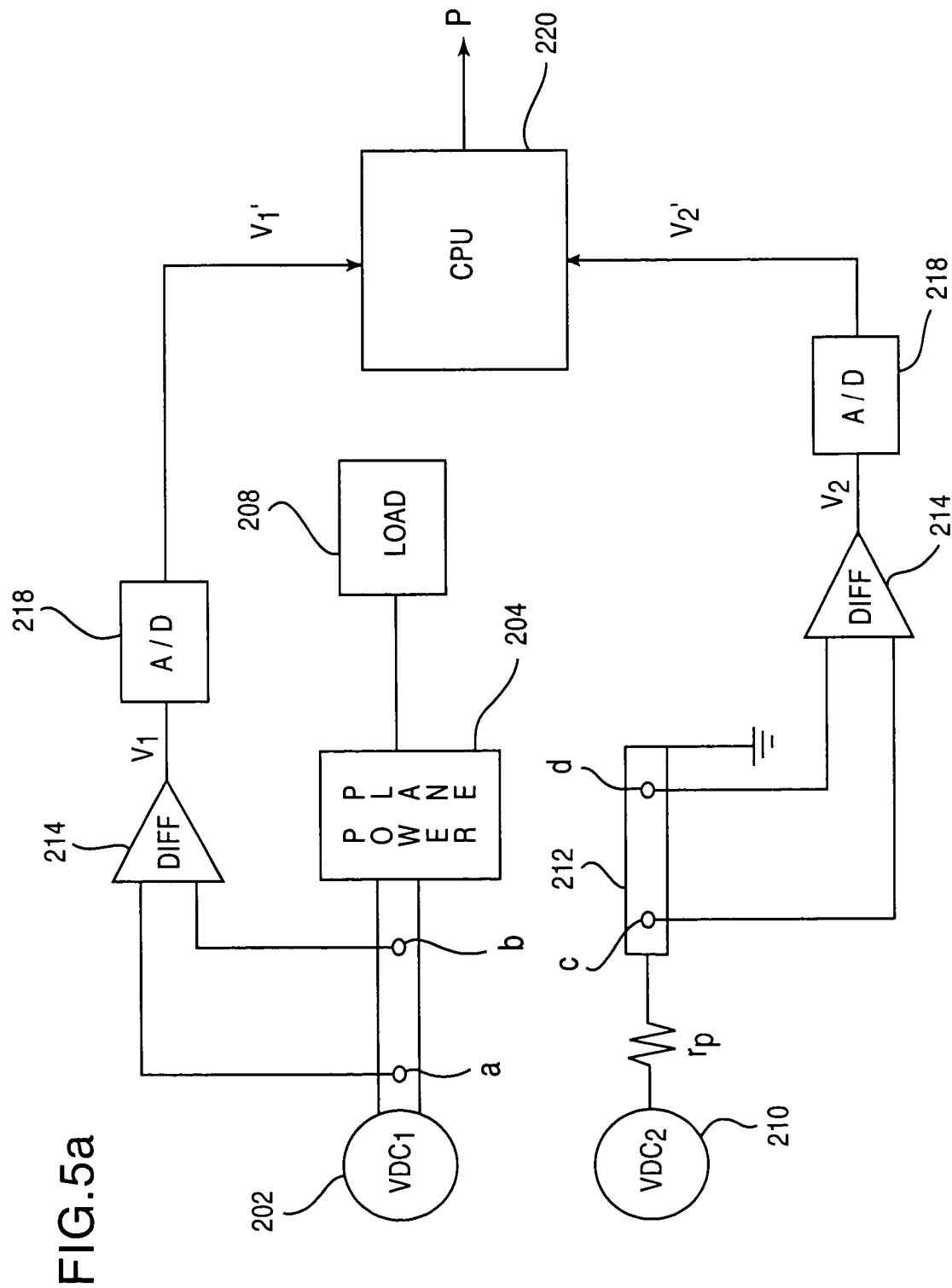
FIG. 5a is a schematic block diagram of an on-board system for measure power of a circuit on a PCB according to a first embodiment of this invention.
Figure 5B:
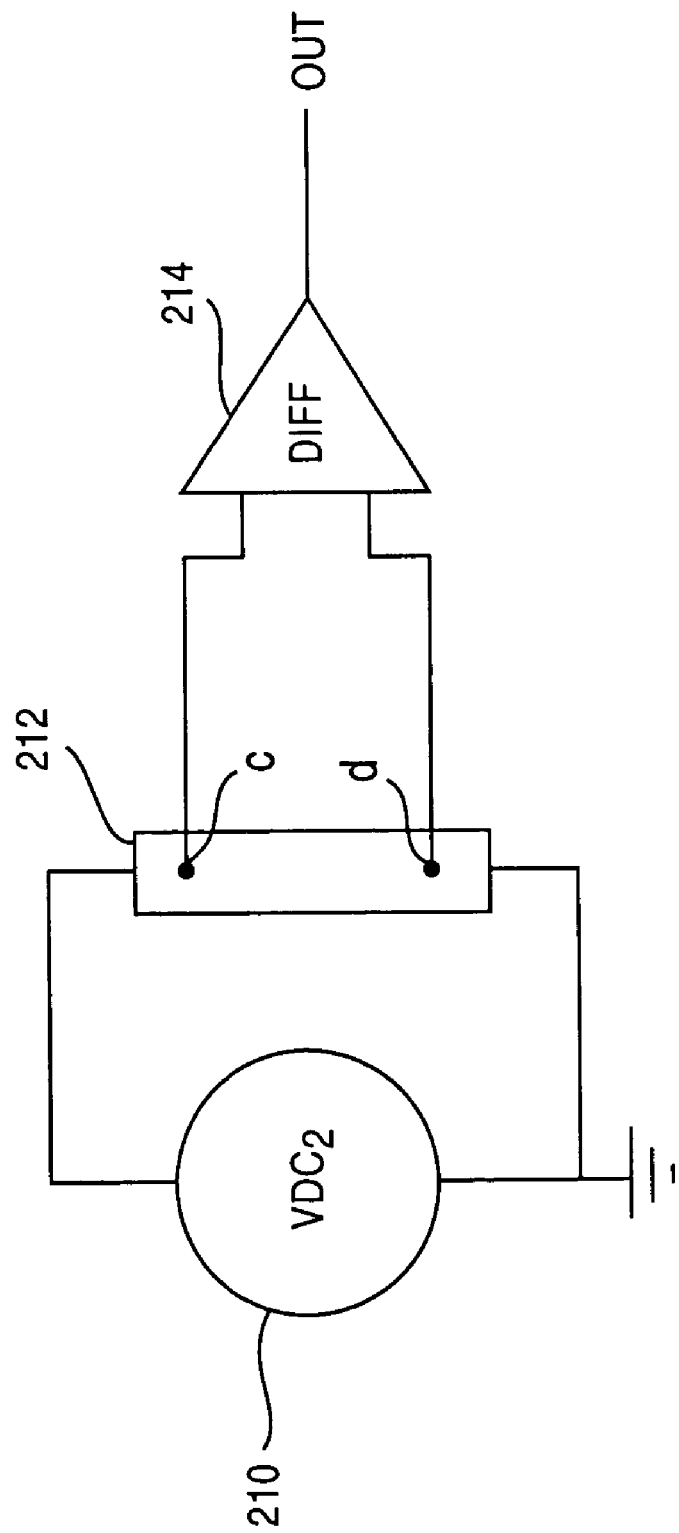
FIG. 5b is a schematic block diagram of an alternative power configuration for an on-board system for measure power of a circuit on a PCB.

FIG. 5b illustrates an alternate power configuration for the calibration strip 212, in the present embodiment. In particular, rather than providing a precision resistor in series with the current supply, the calibration strip 212 is placed directly in parallel with a voltage source 210, and the voltage drop V2 is measured by the differencing circuit 214 from vias c and d, in the same manner as described above. The output of the differencing circuit may be connected to A/D converter 218 as shown in FIG. 5a or to a power determination circuit as shown in FIG. 4.

Figure 6:
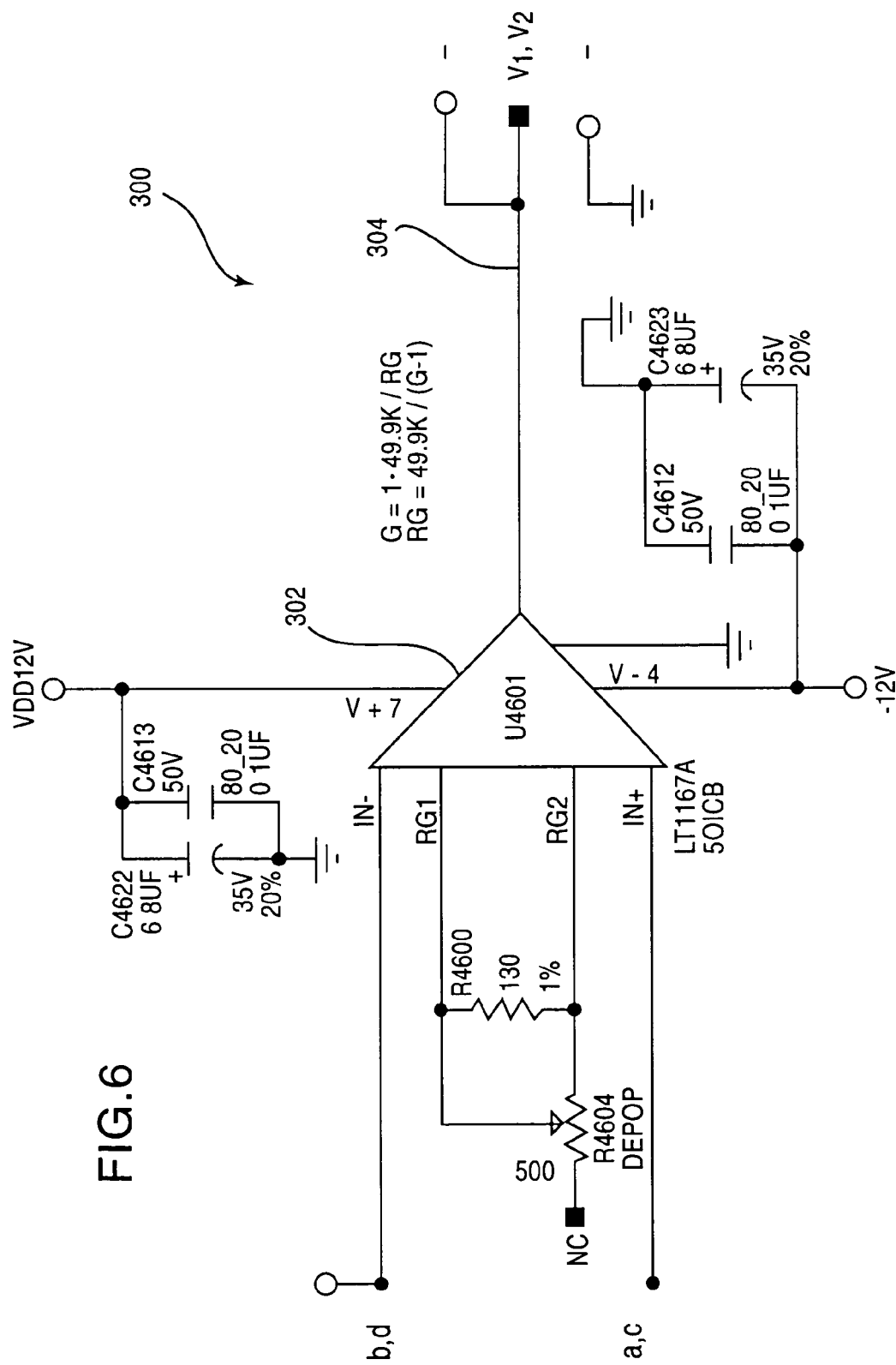
FIG. 6 is a schematic diagram of an on-board circuit for measuring power of a circuit on a PCB according to a second embodiment of this invention.

Referring to FIG. 6, an exemplary operational amplifier (e.g., an instrumentational op. amp.) circuit is shown which could be used as a differencing circuit 214. Circuit 300 includes an operational amplifier 302 having inputs IN+ and IN−, which can be connected to vias a or c, and b or d, respectively. One having ordinary skill in the art will readily understand the application of additional circuitry 306 in order to power, bias, and set the gain for an operational amplifier. Operational amplifier 302 has an amplified output 304 which can produce the signals V1 and V2.

The output 304 (e.g., V1 or V2) of operational amplifier 302 may be input into an A/D converter as shown in FIG. 5, a power calculation circuit as shown in 4, or may be conventionally measured, such as by a meter, oscilloscope or other suitable device. It will be understood by one having ordinary skill in the art that when measuring power across integrated circuits, measurements may be required to be amplified, such as by operational amplifiers or other means. However, the present invention is not meant to be limited as such, and it will be understood that an A/D converter may be provided that is accurate enough to measure such small voltages directly without amplification.

Figure 7:
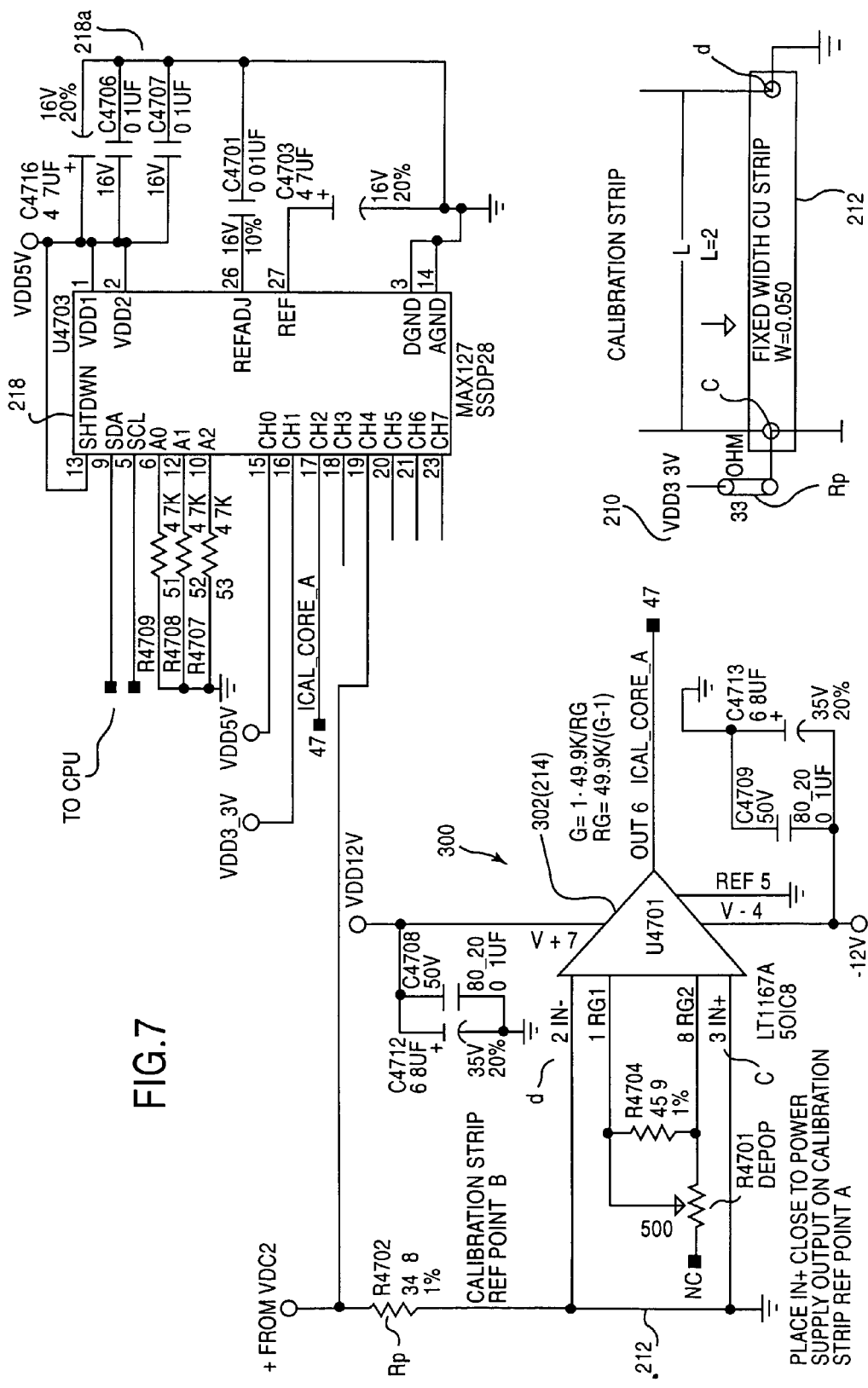
FIG. 7 is a schematic diagram of an on-board circuit for measuring power of a circuit on a PCB according to a second embodiment of this invention.

Referring now to FIG. 7, shown is a schematic diagram of an exemplary configuration of a differencing circuit 214 and A/D converter 218 used to deliver digital signals to CPU 220 or other processing means. In particular, an operational amplifier 302, similarly configured to the operational amplifier circuit 300 shown in FIG. 6, receives the voltages from vias c and d, or a and b, of the calibration strip 212.

The calibration strip 212 is placed in series with an input voltage source 210 and a precision resistor Rp, which is also shown in the expanded view of FIG. 7. The amplified output 47 (304) of the operational amplifier 310, which is the amplified potential V2 (or V1) across the vias of the calibration strip 212 (or power strip 206), is input into a channel of A/D converter 218. A/D converter 218 may be a 12 bit A/D converter with a scale of 0–5V DC, for example, but is not limited as such. The input voltage from voltage source 210 is also input into a channel of the A/D converter 218 as a reference voltage. The A/D converter 218 is powered and biased by circuit 218a. The A/D converter outputs corresponding digital signals (V2' and V reference) which may be input into CPU 220 or other calculation means in order to perform the power calculations. One having ordinary skill in the art will readily understand that the described configuration may be modified to include any number of amplifiers and A/D converters in order to accommodate circuits having more power strips and/or calibration strips.

Figure 8:
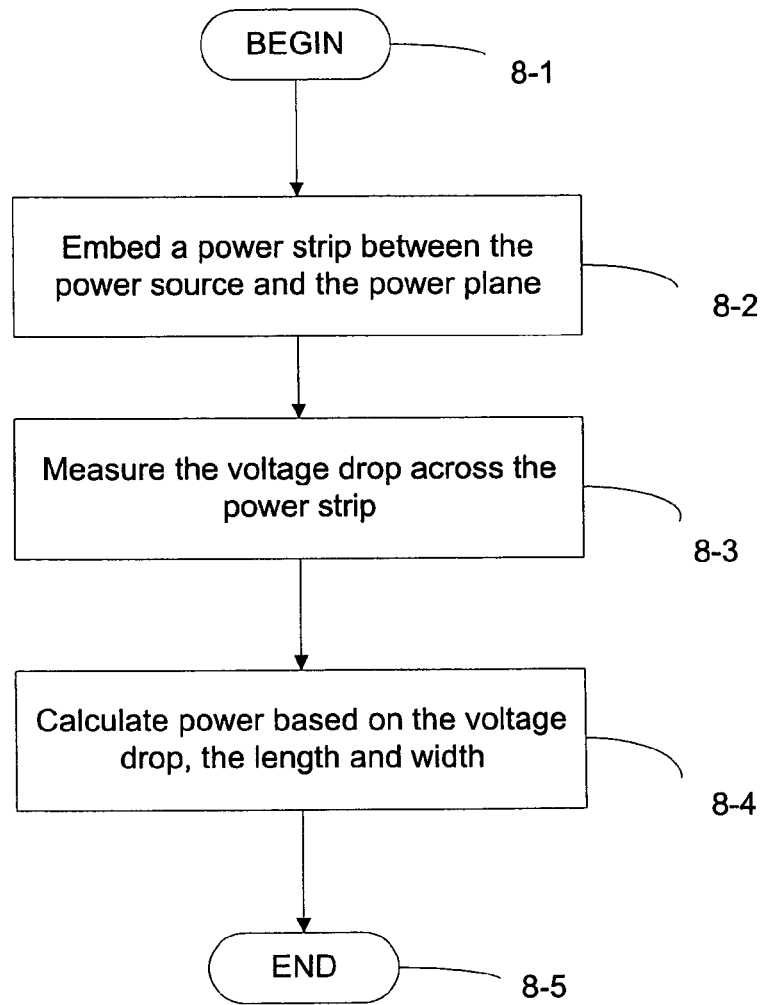
FIG. 8 is flow chart of a system for measuring the power of a circuit on a PCB according to a first embodiment of the present invention.

Referring to FIG. 8, shown is a flowchart of a method for measuring the power of a circuit on a PCB according to an embodiment of the present invention. Processing starts at step 8-1 and proceeds immediately to step 8-2. At step 8-2, a copper strip of known width, thickness and length and having vias, by design is placed between the voltage source and a power plane on a PCB during manufacturing of the PCB. Such a strip is shown and described above with reference to FIG. 3.

Next at step 8-3, the voltage drop across the power strip is measured, such as by a circuit connected to the strip at the vias. Such a circuit has already been described above with reference to FIGS. 2–7.

At step 8-4, once the voltage drop has been measured, the power can be calculated based on the length, width, thickness, voltage across the vias, temperature of the board, resistivity of the strip, and temperature coefficient of the strip. Such a circuit has already been described above and could include a differencing circuit, operational amplifiers, A/D converters, a power calculation circuit, and a CPU. Processing terminates at step 8-5.

Figure 9:
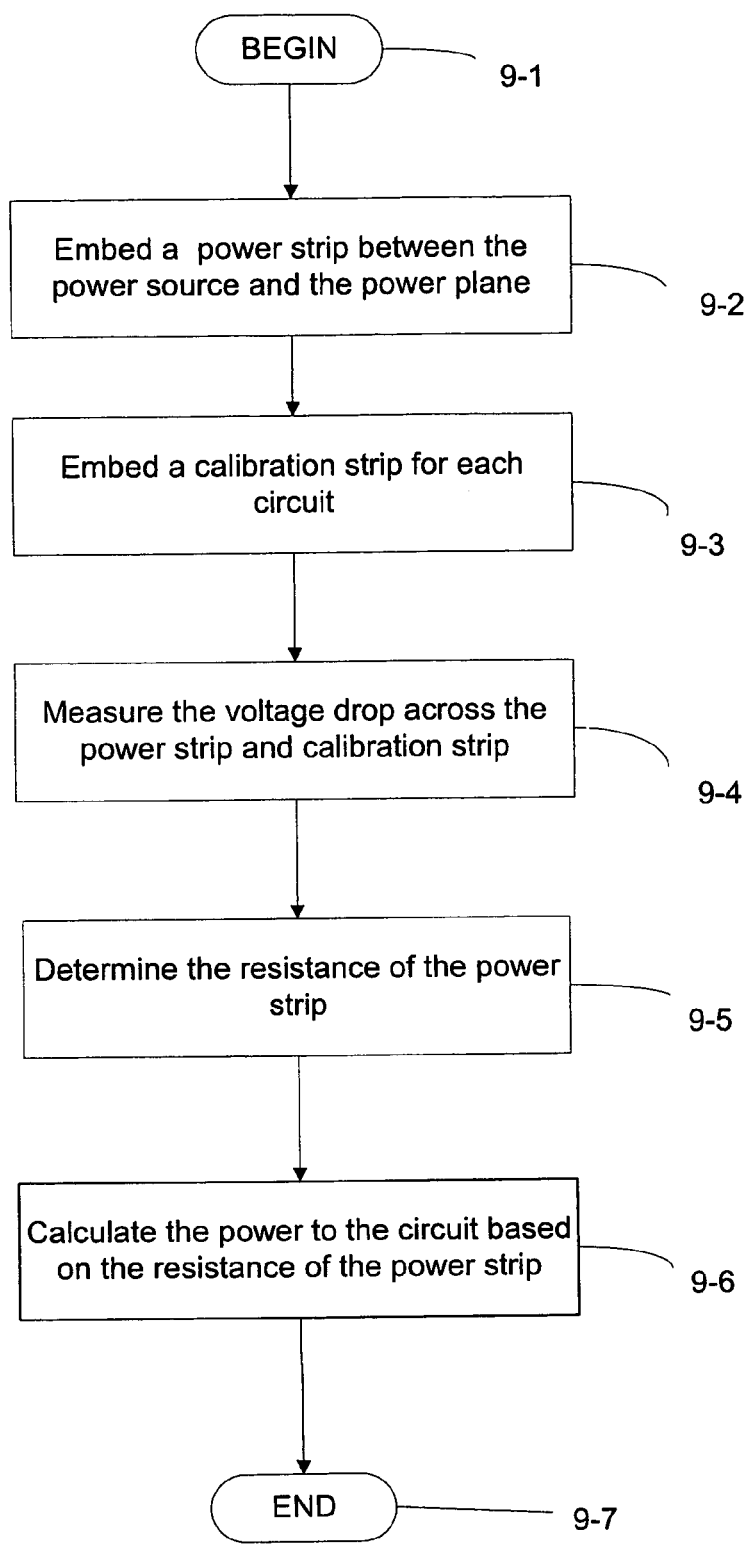
FIG. 9 is flow chart of a system for measuring the power of a circuit on a PCB according to a second embodiment of the present invention.

Referring to FIG. 9, shown is a flowchart of a method for measuring the power of a circuit on a PCB according to another embodiment of the present invention. Processing starts at step 9-1 and proceeds immediately to step 9-2. At step 9-2, a copper strip of known width and length and having vias, is disposed between the voltage source and a power plane feeding a circuit to have its power measured, on a PCB during manufacturing of the PCB; i.e., the power strip may be added during the circuit design process before manufacturing of the PCB. In this way, the strip is part of the PCB. Such a strip is shown and described above with reference to FIG. 3.

Next at step 9-3, a separate calibration strip is disposed in close proximity (e.g., adjacent) to the power strip. Similar to the previous step, the calibration strip can be preferably disposed during the manufacturing of the PCB. This calibration strip is given a power source having a known current, and can be the calibration strip already defined above with reference to FIGS. 4 and 5. Then at step 9-4, after manufacturing and during testing, a voltage drop V1 across the vias of the power strip and a voltage drop V2 across the vias of the calibration strip is measured. Measurement of the V1 and V2 can be done by conventional means or by the onboard circuitry described above with reference to FIGS. 2–7. Once V1 and V2 are known, the resistance of the power strip is determined at step 9-5, and from the resistance, the power of the circuit is calculated at step 9-6. The calculations can be performed via a CPU or a power determination circuit as shown and described with reference to FIGS. 2–7 above. Processing terminates at step 9-7.

Thus, having fully described the invention by way of example with reference to the attached drawing figures, it will readily be appreciated that many changes and modifications may be made to the invention and to the embodiments disclosed without departing from the scope and spirit of the invention as defined by the appended claims. For example, the power strip and the calibration strip can be of any known conductor, semiconductor, or other suitable material. Also, if the temperature of the entire PCB at power is constant, then only one calibration strip is needed for all circuits across the entire board (however, at least one power strip per circuit is still needed).

What is claimed is:

1. A system for measuring core power of a circuit on a printed circuit board (PCB) comprising:
   a first circuit;
   a power plane feeding said first circuit,
   a power strip disposed in said PCB connecting a first power supply to said power plane and having at least two vias for measuring a voltage drop;
   a second circuit configured to measure a first voltage drop across said power strip as a first voltage, a temperature of said power strip, and perform a power calculation by calculating the power being consumed by said first circuit based on said first voltage and said temperature.

2. The system according to claim 1, wherein said power strip comprises substantially pure copper.

3. The system according to claim 1, wherein said power strip has a known length, width and thickness, and said power calculation is further based on said known length, width and thickness.

4. The system according to claim 1, where said power strip is made of a known material having a resistivity and a thermal coefficient, and said power calculation is further based on said resistivity and said thermal coefficient.

5. The system according to claim 1, wherein said second circuit further comprises:
   a differencing circuit configured to measure said first voltage and a second voltage and produce a first signal and a second signal corresponding to said first voltage and said second voltage respectively;
   an analog to digital converter configured to receive said first signal and said second signal from said differencing circuit and to convert said first signal and said second signal into a first digital signal and a second digital signal; and
   a CPU configured to receive said first and second digital signals and perform said power calculation.

6. A system for measuring core power of a circuit on a printed circuit board (PCB) comprising:
   a first circuit;
   a power plane means for feeding said first circuit,
   a power strip means disposed in said PCB for connecting a first power supply to said power plane and having at least two means for measuring a voltage drop;
   a calculating means for measuring a first voltage drop across said power strip means as a first voltage, for measuring a temperature of said power strip means, and for performing a power calculation by calculating the power being fed to said first circuit based on said first voltage and said temperature.

7. The system according to claim 6, wherein said power strip means comprises substantially pure copper.

8. The system according to claim 6, wherein said power strip means has a known length, width and thickness, and said power calculation is further based on said known length, width and thickness.

9. The system according to claim 8, where said power strip means is made of a known material having a resistivity and a thermal coefficient, and said power calculation is further based on said resistivity and said thermal coefficient.

10. The system according to claim 6, wherein said calculating means further comprises:
    a differencing means for measuring said first voltage and a second voltage and producing a first signal and a second signal corresponding to said first voltage and said second voltage respectively;
    an analog to digital converter means for receiving said first signal and said second signal from said differencing circuit and converting said first signal and said second signal into a first digital signal and a second digital signal; and
    a processing means for receiving said first and second digital signals and performing said power calculation.

11. A system for measuring core power of a circuit on a printed circuit board (PCB) comprising:
    a power strip for providing power to a power plane disposed in said PCB connected to said power plane and having at least two vias;
    a calibration strip being disposed in said PCB, said calibration strip having at least two vias for measuring a voltage drop; and
    a second circuit configured to measure a first voltage drop across said at least two vias of said power strip as a first voltage and a second voltage drop across said at least two vias of said calibration strip as a second voltage and to perform a power calculation by calculating a power being fed to a first circuit by the power plane based on said first voltage and said second voltage.

12. The system according to claim 11, wherein said power strip and said calibration strip comprise a same type of material and are disposed in said PCB simultaneously during the manufacturing process.

13. The system according to claim 12, wherein said power strip and said calibration strip comprise substantially pure copper.

14. The system according to claim 11, wherein said calibration strip and said power strip are of a predetermined length and said power calculation is further based on said predetermined length.

15. The system according to claim 11, wherein said power strip has a first predetermined length and width, and said calibration strip has a second predetermined length and width, and said power calculation is further based on said first predetermined length and width and said second predetermined length and width.

16. The system according to claim 11, wherein a first power supply is connected to said power strip and a second power supply is connected to said calibration strip, said second power supply comprising a precision current supply.

17. The system according to claim 11, wherein said calibration strip is connected in series with a precision resistor.

18. The system according to claim 11, wherein said second circuit further comprises:

a first operational amplifier configured to measure said first voltage;

a second operational amplifier configured to measure said second voltage; and an analog to digital converter receiving said first and second voltages output from said first and second operational amplifiers respectively.

19. The system according to claim 11, wherein said second circuit further comprises:

a differencing circuit configured to measure said first voltage and said second voltage and produce a first signal and a second signal corresponding to said first voltage and said second voltage respectively;

an analog to digital converter configured to receive said first signal and said second signal from said differencing circuit and to convert said first signal and said second signal into a first digital signal and a second digital signal; and a calculation circuit configured to receive said first and second digital signals and perform said power calculation.

20. The system according to claim 19, wherein said calculation circuit comprises a computer processor.

21. The system according to claim 11, wherein said calibration strip is disposed in a same proximity of said power strip on said PCB.

* * * * *